United States Patent [19]
Klokholm et al.

[11] 3,949,386
[45] Apr. 6, 1976

[54] BUBBLE DOMAIN DEVICES USING GARNET MATERIALS WITH SINGLE RARE EARTH ION ON ALL DODECAHEDRAL SITES

[75] Inventors: Erik Klokholm, Stamford, Conn.; Thomas S. Plaskett, Katonah, N.Y.

[73] Assignee: International Business Machines Corporation, Armonk, N.Y.

[22] Filed: Nov. 12, 1973

[21] Appl. No.: 415,456

[52] U.S. Cl. .................. 340/174 TF; 252/62.57
[51] Int. Cl.² ................................ G11C 11/14
[58] Field of Search .............. 340/174 TF; 117/235; 252/62.57

[56] References Cited
OTHER PUBLICATIONS
IEEE Transactions on Magnetics, Sept. 1971, pp. 461–463.
IBM Technical Disclosure Bulletin, Vol. 14, No. 7, Dec. 1971, p. 2221.

*Primary Examiner*—James W. Moffitt
*Attorney, Agent, or Firm*—Jackson E. Stanland

[57] ABSTRACT

Bubble domain devices using conventionally known elements for providing a plurality of bubble domain functions, including writing, storage and reading, are provided using a magnetic medium of garnet structure characterized by the presence of a single rare earth ion present in all available dodecahedral lattice sites. These devices operate well over room temperature ranges. This material has sufficiently high anisotropy (of the order $10^5$ ergs/cm³) to support stable magnetic bubble domains in the material. The anisotropy is growth induced and cannot be explained by conventionally accepted theories of anisotropy in garnet bubble domain materials. In preferred embodiments, these rare earth iron garnet films are deposited on suitable substances, which can be any non-magnetic materials having suitable lattice constants to provide substantial lattice match with the magnetic garnet films. Examples are $Eu_3Fe_5O_{12}$ on $Nd_3Ga_5O_{12}$ or $(Pr,Sm)_3Ga_5O_{12}$ substrates; and $Sm_3Fe_5O_{12}$ on $(Pr,Nd)_3Ga_5O_{12}$ substrates.

25 Claims, 5 Drawing Figures

BUBBLE DOMAIN DEVICES USING GARNET MATERIALS WITH SINGLE RARE EARTH ION ON ALL DODECAHEDRAL SITES

BACKGROUND OF THE INVENTION

1. Field of the Invention

This invention relates to magnetic bubble domain devices, and more particularly to magnetic bubble domain devices utilizing as a bubble domain material a rare earth iron garnet characterized by the same rare earth magnetic ion in all available dodecahedral lattice sites.

2. Description of the Prior Art

Magnetic bubble domain devices and systems are well known in the prior art and have conveniently used mixed rare earth iron garnet materials. For example U.S. Pat. No. 3,701,125 shows a complete magnetic bubble domain system for performing the functions of writing, storage, reading, where uniaxial magnetic iron garnets are mentioned as suitable bubble domain materials.

Rare earth iron garnets are part of a family of nominally cubic, ferrimagnetic compounds having the space group Oh(10)-Ia3d and 8 $A_3Fe_5O_{12}$ formula units per unit cell (15). This cell accommodates 96 oxygens and has an edge approximately 12.5 Angstroms in length. There are 24 tetrahedral and 16 octahedral sites within the oxygen array that accommodate Fe and cations of comparable size. There are also 24 dodecahedral sites that accommodate larger cations, such as Y, La, rare earth ions, Bi and Ca ions.

The magnetic moments of the cations in the tetrahedral sites are aligned together. The magnetic moments of the cations in the octahedral sites are also aligned together but are in opposition to those in the tetrahedral sites. Consequently, a net magnetic moment can be established if there are different numbers of Fe ions in the tetrahedral and octahedral sites. This magnetic moment can be decreased by substituting for some of the Fe in the tetrahedral sites, using cations such as $Al^{3+}$, $Ga^{3+}$, $Si^{4+}$, or $V^{5+}$. The magnetic moment can be affected in the opposite way by substitution for the Fe ions in the octahedral sites, using for example cations such as $Zn^{2+}$ or $Se^{3+}$.

There has been much discussion of anisotropy in these rare earth iron garnets in the literature. For instance, a review of growth induced magnetic anisotropy is contained in A. Rosencwaig et al, AIP Conference Proceedings No. 5, Magnetism and Magnetic Materials-1971 (American Institute of Physics, New York, 1972, page 57). In the prior art, growth induced anisotropy is explained in terms of a site preference or pair ordering model in which two or more rare earth ions or one or more rare earth ions and another c-site ion such as Y, are required. A non-random occupation of the c-sites during growth causes an induced uniaxial anisotropy. That is, non cubic anisotropy arises from the differential occupation by different rear earth ions of sites which are inequivalent during the growth process, while being crystallographically equivalent.

U.S. Pat. No. 3,646,529 describes rare earth iron garnets which are suitable for magnetic bubble domain devices at room temperature ranges. These garnet materials have growth induced anisotropy and require a substitution for Fe in order to reduce the magnetic moment due to iron in tetrahedral sites of the material. In addition, preferred compositions use at least two ions in the dodecahedral sites, at least one of which is a moderately weak magnetic iron such as Gd, Tb, Dy, Ho, Eu, and Tm. A non-weak or oppositely aligned magnetic ion such as Sm, Y, La, Ce, Pr, Nd, Yb and Lu is stated as being insufficient by itself to produce favorable bubble domain materials. These garnets are grown at temperatures up to approximately 1200°C in order to obtain the necessary anisotropy.

In this reference, it is stated that garnets containing Gd, Tb, and Dy have magnetizations which are strongly temperature dependent. Compositions using 100 percent of any one of these ions in the dodecahedral lattice sites, without an Fe substitution, are generally undesirable for room temperature device operation, due to their very high magnetization and due to an adverse temperature dependence. Consequently, this reference does not suggest using single rare earth ions in all the dodecahedral lattice sites without an Fe substitution, and in particular does not suggest 100 percent Eu or Sm garnets, with or without Fe substitutions.

U.S. Pat. No. 3,665,427 describes various magnetic bubble domain devices utilizing garnet compositions. These compositions contain at least two ions in the dodecahedral sites which are selected in a particular way so as to reduce magnetostriction in the <111> direction and also in the <100> direction. In the optimum case, it is desired to reduce magnetostriction to a value equal to or very close to zero. Consequently, the dodecahedral sites are occupied by at least two ions of different magnetostriction sign. Preparation of these garnet materials involves growth at temperatures below approximately 1200°C to insure ordering which is needed for magnetically uniaxial alignment. A rare earth iron garnet with only one rare earth ion occupying the available dodecahedral sites is not suitable as a bubble domain material according to the teaching of this reference.

U.S. Pat. No. 3,645,788 also describes magnetic devices using magnetic iron garnet materials. In these materials, a stress induced uniaxial anisotropy results due to thermal expansion coefficient differences between the film and the substrate during cooling from the deposition temperature. That is, there must be sufficient mechanical strain in the garnet film to provide the film with a sufficient uniaxial anisotropy for the formation of magnetic bubble domains therein. In these rare earth iron garnet films, the dodecahedral sites are occupied by at least two ions.

Other theories have been proposed for non-cubic anisotropy in garnets which have no magnetic ions in the rare earth sites and in which $Fe^{3+}$ fills all the octahedral and tetrahedral sites. Anisotropy has been sometimes proposed in such systems as the result of interactions between the Fe sublattices. Other theories such as the "dirt effect" have been proposed to explain this anisotropy. Another theory (W. T. Stacy et al, Solid State Communications 9, page 2005, 1971) depends on the fact that oxygen vacancies can be incorporated in substantial quantities during the growth process. These oxygen vacancies produce large uniaxial crystal fields at the neighboring $Fe^{3+}$ ions. However, this theory for growth induced anisotropy has been debated, as being inconsistent with data concerning the diffusion of oxygen in garnets.

Another theory of anisotropy is that due to Akselrad et al (Applied Physics Letters 19, 464, 1971) which depends upon the fact that the crystal field at a tetrahedral or octahedral site is affected by the size and nature of the ion on nearby dodecahedral sites. Ordering of the non-magnetic ions on the dodecahedral sites is suggested as leading to growth induced anisotropy through the effect of these ions on the crystal field at neighboring $Fe^{3+}$ ions. However, this theory does not account well for effects in pure garnets such as $Y_3Fe_5O_{12}$.

This prior art describing various iron garnet materials suitable for bubble domains leads away from the concept of a room temperature bubble domain device using a rare earth iron garnet material having the same rare earth ion on all of the available dodecahedral lattice sites (hereafter to be called a single rare earth iron garnet). That is, the prior art does not suggest that sufficient uniaxial anisotropy can be obtained in such a garnet in order to support stable magnetic bubble domains at room temperature ranges. The growth induced anisotropies actually obtained in the garnets of this invention cannot be explained as a result of pair ordering or site preference theories, nor can they be explained by an interaction between Fe sublattices. In fact, the prior art theories would lead one to believe that very negligible or zero growth induced uniaxial anisotropy would be obtained in such garnet materials and that the magnetic moment of the material would be so high as to preclude any stable magnetic bubble domain formation. However, it has been discovered that magnetic bubble domain materials containing the same rare earth ion on all available dodecahedral sites, with and without Fe substitutions, can be used to provide stable room temperature magnetic bubble domain devices. Additionally, at least one of the rare earth ions that can be used is one which the prior art would term too weakly magnetic to be used alone with Fe in a garnet for provision of suitable magnetic bubble domain devices.

In addition to the above, an unexpected temperature dependence of the induced uniaxial anisotropy constant $K_u$ was found in these inventive garnet bubble domain devices. This anisotropy increased dramatically when the deposition temperature was lowered and did not approach a zero magnitude as compositions approaching a single rare earth iron garnet were reached.

Numerous advantages result when these single rare earth iron garnet materials are used in room temperature bubble domain devices. For instance, the minimum number of components in these garnets leads to increased process reliability and economy. In addition, processing becomes more simple and involves only a minimum number of components. Also, with certain of these films a garnet substrate can be provided using a Pt crucible for growth rather than an Ir crucible. This reduces fabrication cost even more. Another advantage is that the films can be grown with various thicknesses and will support small magnetic bubble domains of about 1 micron in diameter.

Accordingly, it is a primary object of this invention to provide simple garnet compositions which can be used in bubble domain devices which have stable bubble domains during operation at room temperature ranges.

It is another object of this invention to provide room temperature magnetic bubble domain devices using magnetic materials which are easy to fabricate and utilize only a minimum number of components.

It is still another object of this invention to provide magnetic bubble domain devices using magnetic materials which are economical to fabricate.

It is still another object of this invention to provide magnetic bubble domain devices using magnetic materials which are capable of supporting very small magnetic bubble domains which are stable over room temperature ranges.

It is a further object of this invention to provide magnetic bubble domain devices using improved garnet materials which are very simple and are economical to fabricate.

It is a still further object of this invention to provide room temperature bubble domain devices using improved garnet materials having different crystallographic orientations.

DETAILED DESCRIPTION OF THE PREFERRED EMBODIMENTS

FIG. 1

Figure 1:
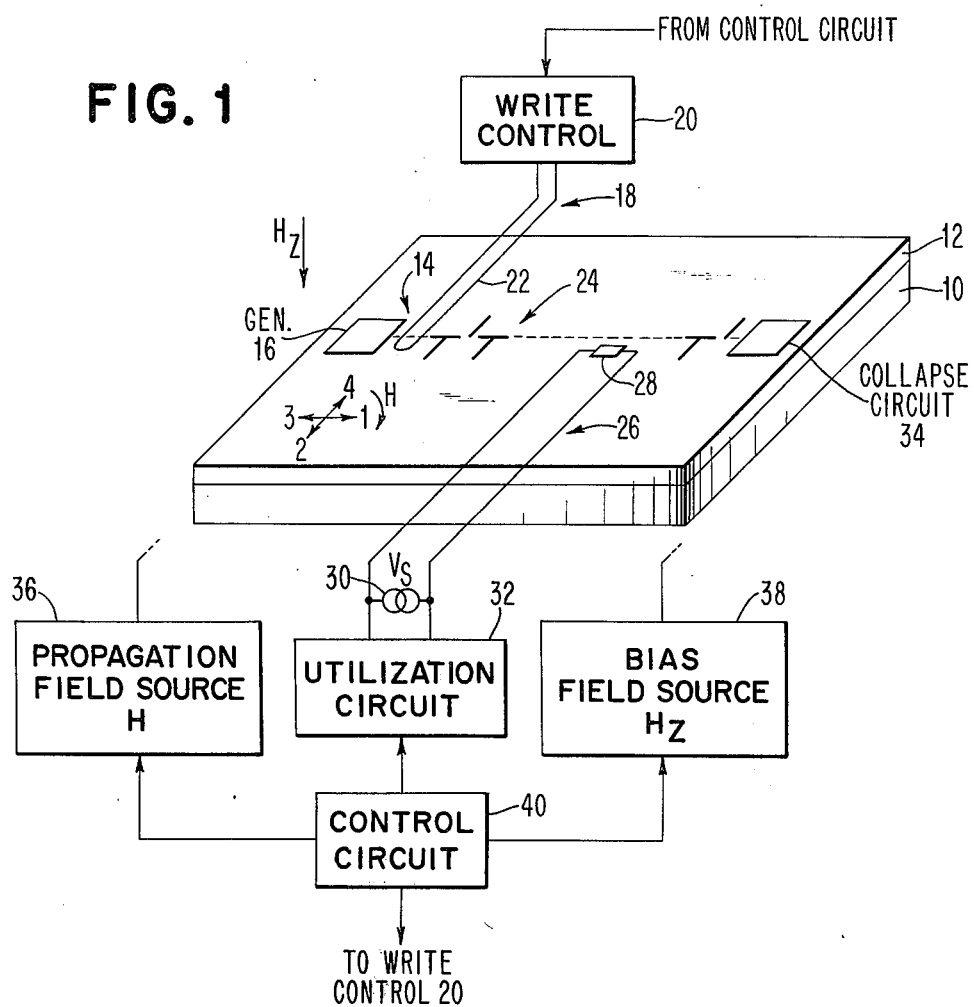
FIG. 1 shows a representative bubble domain system in which various manipulative functions are performed on bubble domains in a magnetic medium.

The bubble domain device of FIG. 1 is illustrative of many well-known magnetic bubble domain devices in which the functions of writing, storage, and reading are provided. Since these devices are well known and since the components used to provide the various functions are well known, the following will be only a brief description of this type of bubble domain system.

In FIG. 1, a substrate 10 has a magnetic bubble domain material 12 thereon. The substrate is any non-magnetic material having a lattice constant $a_{0s}$ which can be matched to the lattice constant $a_{0f}$ of the magnetic bubble domain film 12. Examples of suitable substrates are garnet materials, which will be described in more detail later. The garnet layer 12 is one which contains the same rare earth ion in all its available dodecahedral sites. The representative formula for this garnet is $A_3(Fe,B)_5O_{12}$, where A is a rare earth ion such as Eu or Sm and B is an ion of a material such as Ga, Al, Si, V, Ge, etc. The B ion need not be present for many suitable films.

Various components are located adjacent to layer 12 for provision of the various system functions, such as writing, storage, and reading. These components can be located on the bubble domain layer 12 or can be separated from it by an insulating layer, as is well known in the art. For instance, a typical write means 14 is comprised of a bubble domain generator 16 and a 1/0 control 18. The domain generator 16 can be any of a number of known generators, as for instance the domain nucleator shown in U.S. Pat. No. 3,662,359. Additionally, generator 16 can be of the type which splits domains from a "mother" domain to thereby provide additional domains during each cycle of rotation of the in-plane field H. Such a generator is shown in U.S. Pat. No. 3,555,527.

The 1/0 control 18 is comprised of a write control circuit 20 connected to a current carrying loop 22. When electrical currents are present in loop 22, domains produced by generator 16 are collapsed, thereby producing "zero" bits. However, when currents are not present in loop 22, domains produced by generator 16 are able to move past loop 22, thereby creating "one" bits.

The storage means 24 is conveniently shown as a plurality of T and I bars. These are magnetically soft elements (such as permalloy) which are used to move the magnetic bubble domains in conjunction with a rotating magnetic field H in the plane of the magnetic layer 12. This type of storage is also well known in the art and will not be described further. If desired, storage means 24 can be a closed loop shift register of the type shown in U.S. Pat. No. 3,701,125.

A reading means is generally designated 26 and includes a domain sensing element 28 which is any of a number of well known magnetic domain detectors. In the preferred embodiment, sensing element 28 is a magneto-resistive element comprised of a material such as permalloy. Sensing element 28 is electrically connected to a source 30 of electrical current which provides the measuring current through element 28. In the presence of a magnetic domain having its flux coupled to sensing element 28, the resistance of magneto-resistive element 28 will change and this will be manifested as a voltage signal $V_s$ at the output of the read means 26. This signal is provided to a utilization circuit 32 which could be, for instance, any type of electronic circuitry, including a computer.

If the storage means 24 does not recirculate information, a collapse network 34 is provided to destroy the domains. Such collapse networks are well known in the art and can, for instance, comprise conductors which produce magnetic fields to collapse the domains. Another type of collapse network uses permalloy elements which trap the domains and destroy them as the propagation field H rotates. Permalloy collapse means are described and shown in U.S. Pat. No. 3,727,197.

A propagation field source 36 provides the reorienting, magnetic field H in the plane of bubble domain material 12, while a bias field source 38 provides a magnetic bias field $H_z$. Field $H_z$ is in a direction substantially opposite to the direction of magnetization of the magnetic bubble domains in layer 12, and is conveniently used to stabilize the diameter of these domains. The propagation field source is conveniently a plurality of current carrying coils surrounding the magnetic layer 12, while the bias field source 38 can be a permanent magnet layer adjacent to magnetic layer 12, or a current carrying coil located around magnetic layer 12. These magnetic field sources are well known in the magnetic bubble domain art.

A control circuit 40 provides inputs to utilization circuit 32, propagation field source 36, bias field source 38, and write control 20. These inputs synchronize the write, storage, and reading functions in the overall memory system.

MATERIAL PROPERTIES

The magnetic bubble domain layers 12 are comprised of single rare earth iron garnet materials which provide stable bubble domains at room temperatures. They are given by the general formula $A_3(Fe,B)_5O_{12}$, where A is a magnetic rare earth ion, and B is an ion such as those mentioned previously. The B ion need not be present in these garnets or can be present in an amount which is conveniently chosen with regard to the bubble domain size which is desired. The same rear earth ion occupies all of the available dodecahedral lattice sites. The element Y, which is technically not a rare earth element, is not an element that can be present in the dodecahedral sites of the garnet materials intended for use in the present room temperature devices. As will be explained more fully later, a sufficient induced uniaxial anisotropy is obtained in these films by a growth process. This growth induced process is different than that discussed in the prior art and, in contradistinction to the teaching of the prior art, is of sufficient magnitude to be able to provide stable magnetic bubbles even in view of the high magnetic moment of these garnet materials.

The bubble domain material 12 is lattice matched to the substrate 10, which can be any non-magnetic material having suitable lattice constant $a_{0s}$. The lattice constant matching between the bubble domain material 12 and the substrate 10 is sufficient to provide a mechanically adherent film and does not significantly enter into the anisotropy producing process. In general, if the lattice constant of the substrate is $a_{0s}$ and the lattice constant of the bubble domain film is $a_{0f}$, then $a_{0s}$ can be between $$a_{0s} = a_{0f} + 0.025A \text{ and } a_{0s} = a_{0f} - 0.015A.$$

This typical range insures that a crack-free magnetic film 12 is provided and also sets the approximate limits for films which are in either tension or compression with the substrate. For instance, if $a_{0s} > a_{0f}$, the bubble domain film will be in tension, while if $a_{0s} < a_{0f}$, the bubble domain film 12 will be in compression. A bubble domain film in compression is generally stronger than one in tension, so this is a preferred situation if a perfect lattice match cannot be obtained.

Garnet substrates are particularly convenient and the following table gives some representative bubble domain films and suitable substrates. For these materials, the B-ion can be absent in the tetrahedral and octahedral lattice sites.

| Bubble Domain Film 12 | Substrate 10 |
|---|---|
| $Eu_3(B,FE)_5O_{12}$ | $(Pr,Sm)_3Ga_5O_{12}$ |
|  | $Nd_3Ga_5O_{12}$ |
| $Sm_3(B,Fe)_5O_{12}$ | $(Pr,Nd)_3Ga_5O_{12}$ |

The amount of each element in the dodecahedral sites of the garnet substrate is chosen to give the desired $a_{0s}$ for lattice match to the bubble domain garnet. For instance, the amounts of Pr and Sm in $(Pr,Sm)_3Ga_5O_{12}$ are adjusted to give $a_{0s}$ which is substantially matched to $a_{0f}$ of $Eu_3(Fe,B)_5O_{12}$.

The thickness of the bubble domain garnet 12 can be arbitrarily chosen to provide bubble domains of desired diameter. In general, the bubble domain diameter is approximately twice the thickness of the magnetic film for stable magnetic bubble domains. The characteristic length $l$ of the garnet material is a function of the material and once this is determined a designer would choose the thickness of the film to give the desired bubble domain diameter. Of course, the characteristic length $l$ is a function of the induced uniaxial anisotropy constant $K_u$, exchange constant A, and magnetization $M_s$. Therefore, it is important to be able to provide garnet compositions which will yield appropriate characteristic lengths, and have sufficient uniaxial anisotropy to support magnetic bubble domains. Particularly in the case of the present materials where Fe can occupy all available tetrahedral and octahedral sites, it would not be expected that the induced uniaxial anisotropy would be high enough in a growth induced process to support stable magnetic bubble domains at room temperatures.

The magnetic bubble domain materials of this invention can be grown in several crystallographic orientations, including but not limited to (100) and (111). This is also an advantage since greater freedom is obtained in the fabrication process. Additionally, as will be seen later, the induced anisotropy is a function of growth temperature and differs somewhat depending upon the crystallographic orientation of the bubble domain film 12.

FILM ANISOTROPY

These single rare earth iron garnets have large induced uniaxial anisotropy normal to the film plane greater than about $10^5$ ergs/cm$^3$. This growth induced anisotropy occurs when substantial lattice match is obtained between the bubble domain film and the substrate. This anisotropy is sufficiently large to support stable magnetic bubble domains, even though the iron garnet has high $4\pi M_s$ (for instance, in Eu$_3$Fe$_5$O$_{12}$, $4\pi M_s$ is approximately 1132 Gauss).

The large, non-cubic magnetic anisotropy found in the present single rare earth iron garnets is not expected in such materials, and especially is this the case with the ions of the rare earths Sm and Eu. For instance, the pair ordering or site preference theory, and the interactive Fe sublattice theory of growth induced anisotropy cannot explain the large growth anisotropy found in the present films. According to those theories, any anisotropy which may be found would be due to a so-called "dirt effect" which would be very small. In fact, if the anisotropy is present at all by these theories, it would be expected to be so low that stable magnetic bubble domains at room temperature would not be found in bubble domain film 12.

In the present single rare earth iron garnet materials, the rare earth ion is one which has a large magnetic characteristic (i.e., magnetic moment). The effect on uniaxial anisotropy of the rare earth ion increases as the rare earth ion increases in size (ionic radius). For instance, Eu and Sm are rare earth elements whose ions have wave functions which are greater than many other rare earth ions. Consequently, the Eu and Sm ions couple strongly to the garnet lattice, which means that the interaction with the garnet lattice is large and not localized. In turn, this leads to the large induced uniaxial anisotropy of the present films.

Although the cause of this large growth induced uniaxial anisotropy in the present films is not precisely known, it is understood that this is a low temperature non-cubic induced anisotropy. It is postulated that a constituent (such as Pb) from the flux melt used in growing the film is incorporated into the garnet and causes a lattice disturbance. This in turn is thought to produce a local change in magnetic symmetries which gives rise to a non-cubic anisotropy.

The growth induced anisotropy of the present magnetic bubble domain garnets appears to be strongly temperature dependent and can be tailored by the growth temperature during deposition of the garnet film. It has been observed that as the growth temperature increases the anisotropy diminishes. In accordance with laboratory experiments, it has been determined that a growth temperature less than about 800°C will provide a uniaxial anisotropy normal to the film plane for all orientations. In particular, films of various orientations grown at temperatures less than 800°C had sufficient uniaxial anisotropy to provide stable magnetic bubble domains at room temperature. Although the relationship between growth anisotropy and growth temperature is not well understood, it is suggested that the mount of flux constituent (for instance, lead) incorporated into the growing garnet film increases at lower growth temperatures and that this constituent affects the growth sites, thereby affecting the uniaxial anisotropy. Although the prior art (E. A. Giess et al, AIP Conf. Proc. No. 5, p.110 (1971), discusses the possibility of lead incorporation into garnet films to affect a lattice parameter and thereby affect stress, such prior art does not suggest that the anisotropy would change by large amounts as a function of growth temperature or that the addition of lead could cause such a high magnitude in anisotropy. An additional reference with respect to Pb incorporation into the garnet film is the W. T. Stacy et al article previously cited.

Figure 2:
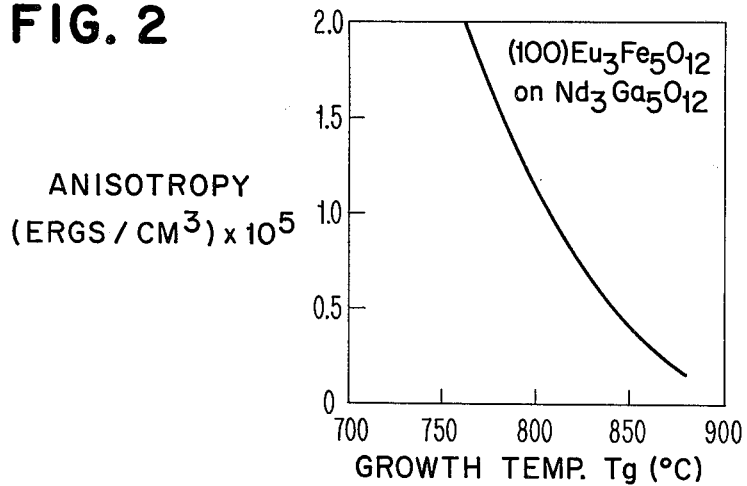
FIG. 2 is a plot of induced uniaxial anisotropy constant $K_u$ versus growth temperature for a garnet magnetic material in accordance with the present invention.

FIGS. 2–5 show various plots of the parameters associated with these single rare earth magnetic iron garnets. For instance, FIG. 2 is a plot of the induced anisotropy constant $K_u$ of a representative single rare earth iron garnet as a function of the growth temperature, for the (100) crystal orientation. This plot represents the total anisotropy where $K_u = K_u^G + K_u^S$, where $K_u^G$ is the contribution due to growth while $K_u^S$ is the contribution due to stress between the substrate and the garnet bubble domain film. However, the contribution of anisotropy due to stress is very small, since there is an approximate lattice match between the substrate (Nd$_3$Ga$_5$O$_{12}$) and the garnet bubble domain layer (Eu$_3$Fe$_5$O$_{12}$).

From FIG. 2, it is apparent that large, growth induced anisotropy normal to the film plane occurs for these garnet films grown at temperatures less than approximately 800°C. This anisotropy is sufficiently great to support stable bubble domains over room temperature ranges.

Figure 3:
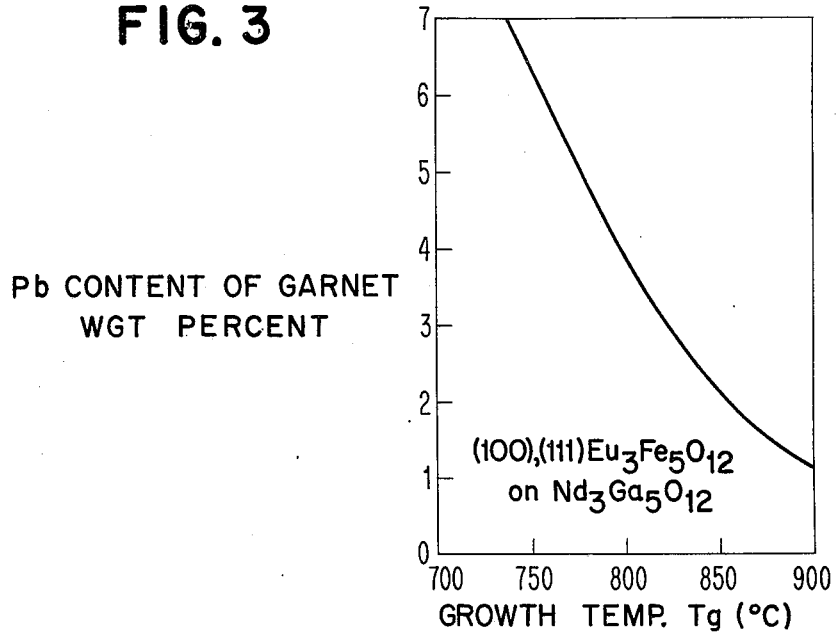
FIG. 3 is a plot of the weight percentage of Pb incorporated into a single rare earth iron garnet film, measured against the growth temperature at which said garnet film is deposited.

FIG. 3 is a plot of the weight percentage of lead incorporated into a single rare earth iron garnet bubble domain film grown from a Pb based flux melt, as a function of the temperature of growth of the garnet film. This plot shows a single curve for the (100) and (111) crystallographic orientations, although for some films there may be separate curves for the two orientations. The amount of any constituent, such as Pb, which comes into the growing film from the melt depends on the distribution coefficient for that constituent. This coefficient is the ratio of the concentration of the constituent in the solid to its concentration in the liquid melt. The coefficient is orientation dependent and growth rate dependent. Consequently, any anisotropy which is due to, for instance, Pb from the melt may be somewhat orientation dependent.

From FIG. 3, it is apparent that the amount of Pb incorporated into the garnet film increases as the growth temperature decreases. For temperatures less than about 800°C, these $Eu_3Fe_5O_{12}$ films exhibited induced uniaxial anisotropy, which may be related to Pb content, as described previously. The contribution of Pb to anisotropy appears to be uniaxial for all orientations.

Figure 4:
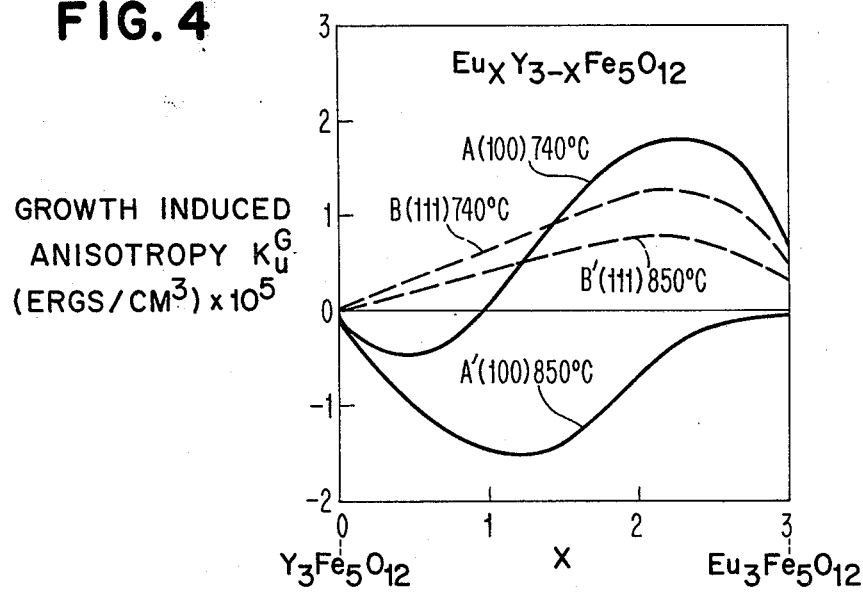
FIG. 4 is a plot of the induced uniaxial anisotropy constant $K_u$ of the present rare earth iron garnet materials as a function of the amount of constituent rare earth ions, plotted for various crystallographic orientations and growth temperatures.

FIG. 4 is a plot of the growth induced anisotropy constant $K_u$ as a function of the constituents of a garnet film for various crystallographic orientations. In particular, this plot shows, as a garnet composition is changed from $Y_3Fe_5O_{12}$ to $Eu_3Fe_5O_{12}$, that the induced uniaxial anisotropy has a sufficient positive value to support stable magnetic bubble domains for films grown at temperatures approximately 740°C. In this context, "positive" means that the easy axis of magnetization is normal to the film plane. As is apparent from this plot, the growth temperature is a substantial factor for films having (100) and (111) crystallographic orientations. When these films are grown at high growth temperatures (such as 850°C), the growth induced anisotropy rapidly approaches zero for $Eu_3Fe_5O_{12}$. This effect is not observed for YIG films at the other endpoint of this mixed system, because Y is not a magnetic rare earth ion.

In more detail, curves A and A' relate to films having (100) orientation, while curves B and B' relate to films having (111) orientation. Curves A and B describe films grown at 740°C while curves A' and B' describe films grown at 850°C. In all cases, liquid phase epitaxy was the growth process.

Thus, it is apparent from FIG. 4 that if the growth temperature is sufficiently low, a single rare earth iron garnet material can be obtained with sufficient uniaxial anisotropy normal to the film plane to support stable magnetic bubble domains at room temperature. This can be achieved even in films having no Fe substitutions, in contrast with the teaching of the prior art which suggests that essentially zero growth induced anisotropy should be found in a film with only one rare earth ion in its dodecahedral lattice sites.

Figure 5:
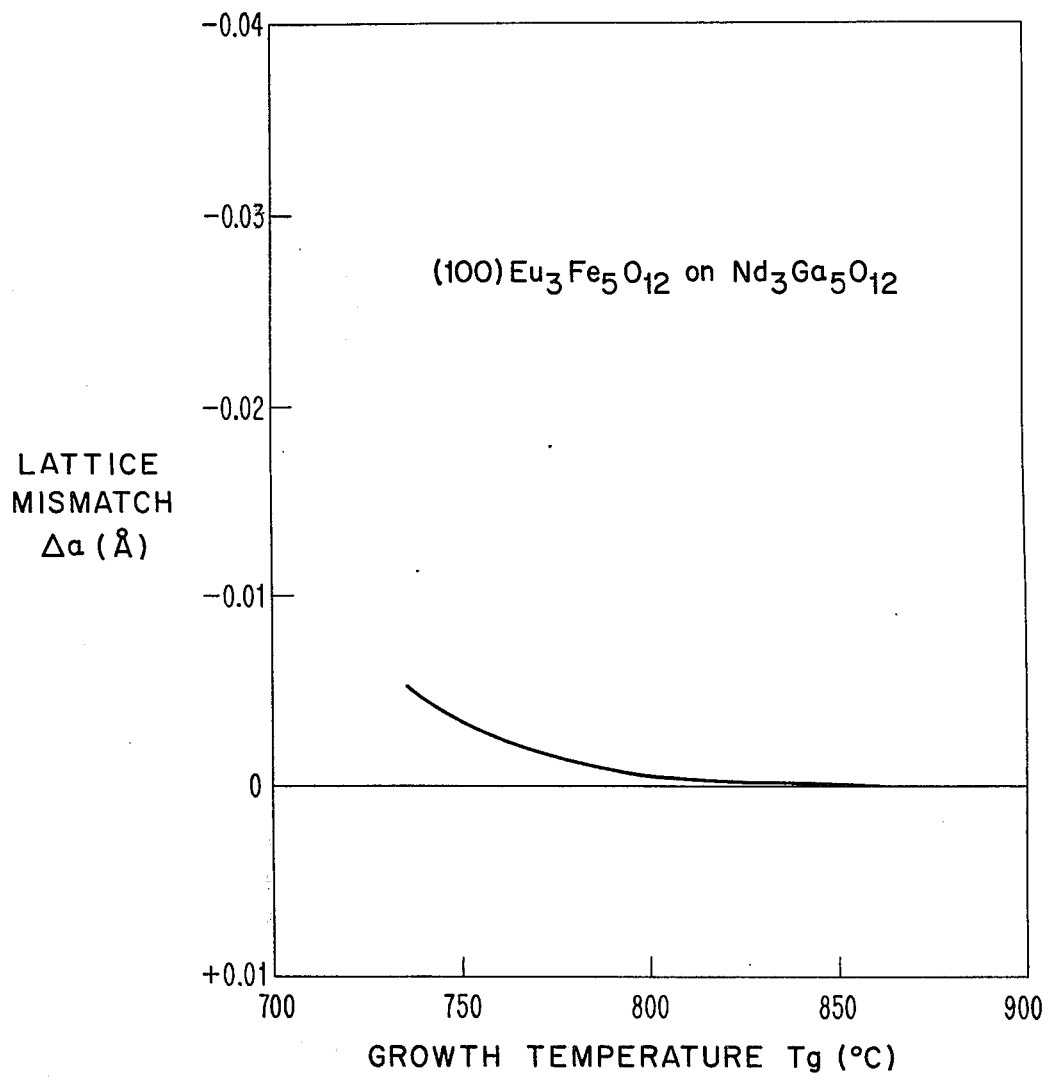
FIG. 5 is a plot of lattice constant mismatch $\Delta a$ between the subject garnet films and the substrates on which they are grown, for various growth temperatures.

FIG. 5 is a plot of the lattice mismatch $\Delta a$ where $\Delta a = a_{0s} - a_{0f}$ for a (100) $Eu_3Fe_5O_{12}$ garnet film on a $Nd_3Ga_5O_{12}$ substrate, over a temperature range used to grow these films. As is apparent from this curve, a small lattice mixmatch $\Delta a = a_{0s} - a_{0f}$ results when the film is grown at low temperatures (<800°C). This mismatch results due to the incorporation of a melt constituent (such as Pb) in the bubble domain film, which causes an expansion of the film lattice. However, this is only a very small mismatch, and the very small stress contribution to $K_u$ can easily be neglected. Consequently, the plot of $K_u$ versus growth temperature (FIG. 2) is essentially a plot of the growth induced uniaxial anisotropy constant $K_u{}^G$.

FABRICATION PROCESS

Preferably, the single rare earth bubble domain materials of this invention are made by a liquid phase epitaxy process (LPE) while the garnet substrates 10 are made by the Czochralski technique. These techniques are generally well known and a reference for the epitaxy process is L. K. Shick et al, Applied Physics Letters, 18, 89 (1971).

In an LPE tipping process, a saturated flux is tipped onto the substrate and growth occurs while the solution is cooled. In more detail, a substrate is located on a platinum holder and a saturated melt is produced by heating constituents to a sufficient temperature to melt them. For instance, if it is desired to epitaxially deposit $Eu_3Fe_5O_{12}$ the flux charge will be comprised of powders of lead oxideboric oxide, together with $Fe_2O_3$ and $Eu_2O_3$. In the case of $Sm_3Fe_5O_{12}$, $Fe_2O_3$ and $Sm_2O_3$ are used in combination with the aforementioned lead oxide and boric oxide powders.

The powder constituents in the charge are heated to a high temperature. After this, the melt is brought down to the growth temperature so that the excess material in the melt will precipitate out in order to provide a saturated solution. The epitaxy apparatus is then tipped so that the saturated melt solution falls onto the substrate. Growth of the garnet occurs by cooling the saturated solution, for instance, at approximately 4°C/minute. This causes the solution to become supersaturated and excess garnet leaves the melt to precipitate on the substrate. After a sufficient thickness is obtained, the apparatus is tipped to carry the melt away from the substrate. The film thickness can be measured by optical interference techniques and the lattice mismatch between the bubble domain film and the substrate can be measured by X-ray diffraction techniques.

In addition to the tipping LPE process, a "dipping" LPE process can also be used. This process is similar to the tipping process except that a substrate is dipped into a supersaturated melt to effect growth.

The garnet substrates are made by the Czochralski technique and growth occurs from a stoichiometric melt of a garnet crystal. For instance, a $Nd_3Ga_5O_{12}$ substrate can be prepared by mixing $Nd_2O_3$ and $Ga_2O_3$ in a crucible. These constituents are melted to provide a melt of $Nd_3Ga_5O_{12}$. A seed crystal is inserted into this melt and slowly pulled therefrom to grow a wafer of $Nd_3Ga_5O_{12}$ which is then sliced to provide suitable substrates.

As mentioned previously, the LPE process used to grow the bubble domain garnet films provides films with sufficient induced uniaxial anisotropy for growth at temperatures less than about 800°C. This occurs for crystallographic orientations, such as (100) and (111). The lower limit of the flux melt is that at which the melt begins freezing. For the compositions discussed, this occurs at a temperature of approximately 740°C. The growth time was about 1 – 8 minutes which will provide a film thickness range of 0.5 – 2 microns.

In addition to this particular flux charge, other flux charges (such as barium oxide based fluxes) should also be suitable for the practice of this epitaxy process.

One advantage of these garnet materials is that cheaper substrates can be provided than is presently the case. For instance, $Gd_3Ga_5O_{12}$ (GGG) substrates are commonly used with most magnetic bubble domain garnet films. However, when $Eu_3(B,Fe)_5O_{12}$ is the bubble domain material, the substrate is preferably $Nd_3Ga_5O_{12}$. Since Nd is significantly cheaper than Gd, significant cost reductions are obtained. Additionally, the Nd based garnet substrate can be grown in platinum crucibles rather than iridium crucibles thereby leading to further reductions in cost. This is based on the fact that Nd melts at about 1520°C, while Gd melts at about 1825°C.

What has been described are bubble domain devices in which the magnetic bubble domain material is an iron garnet characterized by only one rare earth ion in all its available dodecahedral lattice sites. This leads to a class of stable room temperature magnetic bubble domain devices useful in high density applications, since these garnet films will support small magnetic bubble domains. Additionally, the films are characterized by good mobility, and are mechanically adherent to substrates while being crack-free. Due to the minimum number of components, the films are readily prepared using conventional techniques and provide reliable films at a minimum cost. Also, the induced uniaxial anisotropy of these garnet films can be tailored in accordance with growth temperature, as described herein.

The rare earth ions which are useful in the present invention are those which are magnetic and have a sizeable influence on the garnet lattice. The use of non-magnetic or weakly magnetic ions which do not have sufficient ionic radius will not provide sufficient induced uniaxial anisotropy to overcome the high magnetization of these materials. Therefore, the provision of films capable of supporting magnetic bubble domains which will be stable at room temperature over a range of bias fields between collapse and run-out requires proper choice of the single rare earth ion which fills all of the available dodecahedral sites of the garnet lattice.

What is claimed is:

1. A magnetic bubble domain device comprised of a magnetic medium of thickness less than about two microns capable of supporting magnetic bubble domains therein, and means adjacent thereto for manipulating said domains in said medium, said medium having a garnet structure with a lattice comprised of dodecahedral sites, tetrahedral sites, and octahedral sites wherein all of said dodecahedral sites are occupied by the same rare earth ion, and all of said tetrahedral and octahedral sites are occupied by a single magnetic ion, said medium having a growth induced uniaxial anisotropy of sufficient magnitude to support stable magnetic bubble domains therein over room temperature range.

2. The device of claim 1, where said single rare earth ion is Eu.

3. The device of claim 1, where said single rare earth ion is Sm.

4. The device of claim 1, where said magnetic ion is Fe.

5. The device of claim 1, further including a substrate on which said magnetic medium is located, said substrate being comprised of a non-magnetic material whose lattice constant $a_{0s}$ is substantially matched to the lattice constant $a_{0f}$ of said magnetic medium.

6. The device of claim 5, where $a_{0s}$ is between about ($a_{0f} - 0.015$ Angstroms) and ($a_{0f} + 0.025$ Angstroms).

7. The device of claim 5, where said magnetic medium is an epitaxial film on said substrate, the crystallographic orientation of said film being (100).

8. The device of claim 5, where said magnetic medium is an epitaxial film on said substrate, the crystallographic orientation of said film being (111).

9. A method for making a magnetic bubble domain device, comprising the steps of:
providing a non-magnetic substrate having a lattice constant $a_{0s}$,
epitaxially depositing onto said substrate a magnetic material having garnet structure with a lattice constant $a_{0f}$ substantially matched to said lattice constant $a_{0s}$, and inducing sufficient growth-induced uniaxial growtn anisotropy in said magnetic material to support magnetic bubble domains therein, said magnetic material having a unit formula $A_3Fe_5O_{12}$, where A is a single rare earth ion occupying all available dodecahedral lattice sites in said garnet structure, and Fe occupies all tetrahedral and octahedral lattice sites in said garnet structure,
providing means adjacent to said magnetic material for manipulating said domains in said magnetic material.

10. The method of claim 9, where said epitaxial deposition is liquid phase epitaxy occurring at a temperature less than about 750°C.

11. The method of claim 9, where said single rare earth ion is Eu.

12. The method of claim 9, where said single rare earth ion is Sm.

13. The method of claim 9, where said magnetic material is epitaxially deposited with a (111) crystallographic orientation.

14. The method of claim 9, where said magnetic material is epitaxially deposited onto said substrate with a (100) crystallographic orientation.

15. The method of claim 9, where said liquid phase epitaxy occurs from a melt having Pb therein.

16. A magnetic bubble domain device comprised of a magnetic medium capable of supporting magnetic bubble domains therein, and means adjacent thereto for manipulating said domains in said medium, said magnetic medium being an epitaxial film of $Eu_3(Fe,B)_5O_{12}$, where B is an ion which occupies an octahedral or tetrahedral lattice site of said magnetic medium, located on a substrate selected from the group consisting of $Nd_3Ga_5O_{12}$ and $(Pr,Sm)_3Ga_5O_{12}$, said magnetic material having a lattice constant substantially matched to the lattice constant of said substrate and having sufficiently high growth induced uniaxial anisotropy for support of stable magnetic bubble domains therein.

17. A magnetic bubble domain device comprised of a magnetic medium capable of supporting magnetic bubble domains therein, and means adjacent thereto for manipulation of said domains in said magnetic medium, said magnetic medium being $Sm_3(Fe,B)_5O_{12}$, where B is an ion which occupies an octahedral or tetrahedral lattice site of said magnetic medium, epitaxially located on a substrate comprised of $(Pr,Nd)_3Ga_5O_{12}$, said magnetic medium being further characterized by a garnet structure and having sufficient growtn-induced uniaxial anisotropy to support stable magnetic bubble domains therein.

18. A magnetic bubble domain device which is comprised of a magnetic material having a garnet structure characterized by growth induced uniaxial anisotropy of sufficient magnitude to support stable magnetic bubble domains therein over room temperature range, said magnetic material having dodecahedral lattice sites all available ones of which are occupied by the same magnetic rare earth ion, said magnetic material also having tetrahedral and octahedral lattice sites which are occupied by at least one magnetic ion.

19. A magnetic bubble domain device comprised of a magnetic material having a garnet structure characterized by growth induced uniaxial anisotropy of sufficient magnitude to support stable magnetic bubble domains therein at room temperatures, said magnetic material being comprised of $Eu_3(Fe,B)_5O_{12}$, where B is an ion occupying a tetrahedral or octahedral lattice site of said garnet structure, and means for manipulating said bubble domains in said magnetic material.

20. A magnetic bubble domain device comprised of a magnetic material having a garnet structure characterized by growth induced uniaxial anisotropy of sufficient magnitude to support stable magnetic bubble domains therein at room temperatures, said magnetic material being comprised of $Sm_3(Fe,B)_5O_{12}$, where B is an ion occupying a tetrahedral or octahedral lattice site of said garnet structure, and means for manipulating said bubble domains in said magnetic material.

21. A magnetic bubble domain device which is comprised of a layer of magnetic material with a garnet structure having growth induced uniaxial anisotropy of sufficient magnitude to support very small diameter magnetic bubble domains in a layer having a thickness less than about 2 microns over room temperature range, said magnetic material having dodecahedral lattice sites all available ones of which are occupied by the same magnetic rare earth ion, said magnetic material also having tetrahedral and octahedral lattice sites which are occupied by at least one magnetic ion.

22. The device of claim 21, where said magnetic material has Pb therein.

23. A magnetic bubble domain device which is comprised of a layer of magnetic material with a garnet structure having a magnetic uniaxial anisotropy due to Pb therein which is sufficiently large to support stable, very small diameter magnetic bubble domains in a layer having a thickness less than about 2 microns, said magnetic material having dodecahedral lattice sites all available ones of which are occupied by a single rare earth ion selected from the group consisting of Eu and Sm, said magnetic material also having tetrahedral and octahedral lattice sites which are occupied by at least one magnetic ion.

24. A method for making a magnetic bubble domain device, comprising the steps of:

depositing a magnetic material on a non-magnetic substrate to a thickness less than about two microns, said magnetic material having a garnet structure with a unit formula $A_3(Fe,B)_5O_{12}$ where A is a rare earth magnetic ion selected from the group consisting of Eu and Sm, and B is an ion occupying a tetrahedral or octahedral lattice site of said garnet structure, and incorporating sufficient amounts of Pb in said magnetic material during said deposition to produce a sufficiently large anisotropy in said magnetic material to support stable magnetic bubble domains therein at room temperatures, and providing means for manipulating said bubble domains in said magnetic material.

25. The method of claim 24, where said deposition occurs at a temperature less than about 750°C.

* * * * *

UNITED STATES PATENT AND TRADEMARK OFFICE
CERTIFICATE OF CORRECTION

PATENT NO. : 3,949,386
DATED : April 6, 1976
INVENTOR(S) : Erik Klokholm and Thomas S. Plaskett It is certified that error appears in the above-identified patent and that said Letters Patent are hereby corrected as shown below:

Column 1, line 59, "rear" should read --rare--.

Column 6, line 11, "rear" should read --rare--.

Column 8, line 20, "mount" should read --amount--.

Column 11, line 68, "growtn" should read --growth--.

Signed and Sealed this

Thirty-first Day of May 1977

[SEAL]

Attest:

RUTH C. MASON
*Attesting Officer*

C. MARSHALL DANN
*Commissioner of Patents and Trademarks*